(12) United States Patent
Shan et al.

(10) Patent No.: US 11,339,957 B2
(45) Date of Patent: *May 24, 2022

(54) LED HOSE LAMP, AND PRODUCTION METHOD AND DEVICE THEREOF

(71) Applicant: Zhuhai Bojay Electronics Co. Ltd., Guangdong (CN)

(72) Inventors: Xiwan Shan, Guangdong (CN); Tuxiu Yang, Guangdong (CN); Yundong Ai, Guangdong (CN); Jie Zhang, Guangdong (CN); Qunlin Li, Guangdong (CN); Qiming Liu, Guangdong (CN); Su Yan, Guangdong (CN); Yanyong Liu, Guangdong (CN); Junchao He, Guangdong (CN); Jiahui Cai, Guangdong (CN); Yue Chen, Guangdong (CN)

(73) Assignee: Zhuhai Bojay Electronics Co. Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/888,296

(22) Filed: May 29, 2020

(65) Prior Publication Data

US 2021/0071854 A1 Mar. 11, 2021

(30) Foreign Application Priority Data

Sep. 6, 2019 (CN) .......................... 201910842801.5

(51) Int. Cl.
*F21V 23/00* (2015.01)
*F21S 4/26* (2016.01)
(Continued)

(52) U.S. Cl.
CPC .............. *F21V 23/001* (2013.01); *F21S 4/26* (2016.01); *H05K 1/181* (2013.01);
(Continued)

(58) Field of Classification Search
CPC .......... F21V 23/001; F21S 4/26; H05K 1/181; H05K 2201/10106; F21Y 2103/10; F21Y 2115/10; F21K 9/90
See application file for complete search history.

(56) References Cited

U.S. PATENT DOCUMENTS 7,901,263 B2 3/2011 Tsai
7,926,978 B2 4/2011 Tsai
(Continued)

FOREIGN PATENT DOCUMENTS

CN 201688230 U 12/2010
CN 203560768 U 4/2014
(Continued)

OTHER PUBLICATIONS

U.S. Appl. No. 16/888,222 Non-Provisional Application, filed May 29, 2020, 29 pages.
(Continued)

*Primary Examiner* — Tracie Y Green
(74) *Attorney, Agent, or Firm* — Adsero IP

(57) ABSTRACT

An LED hose lamp includes: an LED string light including a first conducting wire, a second conducting wire, a third conducting wire, a plurality of SMD LEDs and a plurality of encapsulation colloids, wherein a plurality of first and second welding spots are formed by removing insulation layers of the first and second conducting wire at intervals of a predetermined distance along axial directions of the first and second conducting wires respectively, two welding legs of each SMD LED are respectively welded onto a first welding spot and a second welding spot, the plurality of encapsulation colloids respectively coat the plurality of SMD LEDs and surfaces of portions of the third conducting wire corresponding to positions of the plurality of the SMD LEDs; and a soft tube coating outside the first conducting wire, the
(Continued)

second conducting wire, the third conducting wire and the encapsulation colloid through an injection molding.

5 Claims, 9 Drawing Sheets

(51) Int. Cl.
*H05K 1/18* (2006.01)
*F21Y 103/10* (2016.01)
*F21Y 115/10* (2016.01)

(52) U.S. Cl.
CPC ....... *F21Y 2103/10* (2016.08); *F21Y 2115/10* (2016.08); *H05K 2201/10106* (2013.01)

(56) References Cited

U.S. PATENT DOCUMENTS

| | | | |
|---|---|---|---|
| 10,281,094 | B2 | 5/2019 | Liu |
| 10,907,781 | B2 * | 2/2021 | Shao .................. F21S 4/22 |
| 10,920,941 | B1 | 2/2021 | Shan et al. |
| 11,118,743 | B2 * | 9/2021 | Shan .................. F21K 9/90 |
| 11,204,140 | B2 | 12/2021 | Shan et al. |
| 2002/0089859 | A1 | 7/2002 | Jackson et al. |
| 2005/0207151 | A1 | 9/2005 | Aanegola et al. |
| 2007/0208395 | A1 | 9/2007 | Leclerc et al. |
| 2008/0200089 | A1 | 8/2008 | Tsai |
| 2011/0310601 | A1 | 12/2011 | Shao |
| 2014/0009074 | A1 | 1/2014 | Chen |
| 2014/0268818 | A1 | 9/2014 | Huang et al. |
| 2015/0077999 | A1 | 3/2015 | Chen |
| 2016/0341408 | A1 * | 11/2016 | Altamura ............ F21S 4/10 |
| 2017/0328527 | A1 | 11/2017 | Yang et al. |
| 2017/0336037 | A1 | 11/2017 | Chien |
| 2018/0119929 | A1 | 5/2018 | Weiss |
| 2018/0209595 | A1 * | 7/2018 | Liu ...................... F21V 31/04 |
| 2019/0069649 | A1 | 3/2019 | Qin |
| 2019/0101254 | A1 | 4/2019 | Tsai |
| 2019/0234597 | A1 | 8/2019 | Zhu |
| 2019/0277458 | A1 | 9/2019 | Shao |
| 2019/0368670 | A1 | 12/2019 | Gao |
| 2019/0376669 | A1 | 12/2019 | Shao et al. |
| 2020/0278091 | A1 | 9/2020 | Chen et al. |
| 2021/0071827 | A1 | 3/2021 | Shan et al. |
| 2021/0071828 | A1 | 3/2021 | Shan et al. |
| 2021/0071829 | A1 * | 3/2021 | Shan ................... F21V 31/005 |
| 2021/0071850 | A1 * | 3/2021 | Shan ................... F21S 4/20 |
| 2021/0071852 | A1 * | 3/2021 | Shan ................... F21S 4/10 |
| 2021/0071854 | A1 | 3/2021 | Shan et al. |

FOREIGN PATENT DOCUMENTS

| | | |
|---|---|---|
| CN | 203571516 U | 4/2014 |
| CN | 203771161 U | 8/2014 |
| CN | 204328616 U | 5/2015 |
| CN | 205535227 U | 8/2016 |
| CN | 206496230 U | 9/2017 |
| CN | 107559646 A | 1/2018 |
| CN | 207539677 U | 6/2018 |
| CN | 110617414 A | 12/2019 |
| GB | 2586903 A | 6/2020 |
| GB | 2586908 A | 3/2021 |
| KR | 10-1629749 B1 | 6/2016 |
| WO | WO-2019-041745 A1 | 3/2019 |

OTHER PUBLICATIONS

U.S. Appl. No. 16/888,282 Non-Provisional Application, filed May 29, 2020, 36 pages.
U.S. Appl. No. 16/888,286 Non-Provisional Application, filed May 29, 2020, 36 pages.
U.S. Appl. No. 16/888,290 Non-Provisional Application, filed May 29, 2020, 31 pages.
GB Application No. GB2006270.9, Examination Report dated Jun. 12, 2020, 1 page.
GB Application No. GB2006270.9, Search Report dated Jun. 11, 2020, 1 page.
U.S. Appl. No. 17/002,105 Non-Provisional Application, filed Aug. 25, 2020, 72 pages.
GB Application No. GB2006267.5, Examination Report dated Jun. 12, 2020, 2 pages.
GB Application No. GB2007273.2, Examination Report dated Jun. 15, 2020, 2 pages.
GB Application No. GB2006271.7, Examination Report dated Jun. 12, 2020, 2 pages.
U.S. Appl. No. 16/888,282 Non-Final Office Action, dated Mar. 8, 2021, 95 pages.
Extended European Search Report, Application No. 20194300.8, dated Feb. 9, 2021, 8 pages.
U.S. Appl. No. 16/888,290 Notice of Allowance, dated Nov. 13, 2020, 20 pages.
U.S. Appl. No. 16/888,222 Non-Final Office Action, dated Dec. 16, 2020 pages.
U.S. Appl. No. 16/888,282 Office Action—Restriction Requirement, dated Dec. 18, 2020, 7 pages.
U.S. Appl. No. 16/888,286 Non-Final Office Action dated Jan. 27, 2021, 27 pages.
U.S. Appl. No. 16/888,222 Notice of Allowance, dated May 18, 2021, 36 pages.
U.S. Appl. No. 16/888,286 Final Office Action dated Jul. 16, 2021, 28 pages.
Canadian Application No. 3080041, Office Action, dated Jun. 29, 2021, 6 pages.
Canadian Application No. 3,089,796, Office Action, dated Jun. 25, 2021, 5 pages.
Canadian Application No. 3,081,297, Office Action, dated Jul. 7, 2021, 4 pages.
U.S. Appl. No. 16/888,282 Notice of Allowance, dated Dec. 17, 2021, 33 pages.

* cited by examiner

LED HOSE LAMP, AND PRODUCTION METHOD AND DEVICE THEREOF

CROSS-REFERENCE TO RELATED APPLICATION

The present application claims priority to Chinese Patent Application No. 201910842801.5, entitled "LED Hose Lamp, and Production Method and Device thereof", filed on Sep. 6, 2019, the entire content of which is thereby incorporated herein by reference in its entirety.

TECHNICAL FIELD

The present disclosure relates to the field of lighting technology, and particularly to a LED hose lamp, and a production method and device thereof.

BACKGROUND

The existing LED hose lamp usually consists of an LED string light and a modulator tube disposed outside the LED string light. The LED string light consists of two side-by-side conducting wires, a plurality of Surface Mounted Devices (SMD) LEDs mounted on the two conducting wires at intervals of a certain distance in a length direction of the conducting wire, and a plurality of encapsulation colloids encapsulating the SMD LEDs therein. The existing LED string light usually consists of two side-by-side conducting wires, a plurality of SMD LEDs mounted on the two conducting wires at intervals of a certain distance in a length direction of the conducting wire and a plurality of encapsulation colloids encapsulating the SMD LEDs therein. The SMD LEDs of such LED string light are connected in parallel. Due to the limitation of the power supply and the voltage attenuation, the length of the string light is limited and the production efficiency is low. Also some string lights are made in series by cutting off one conducting wire between two adjacent LEDs. However, when such string light is subjected to an external force, the two conducting wires are easy to move relative to each other, such that the LED on the conducting wire falls off easily.

SUMMARY

As for the above condition of the prior art, the present disclosure provides an LED hose lamp with a high strength, a high production efficiency and a high product quality. Another problem to be solved by the present disclosure is to provides a production method and device for an LED hose lamp.

In order to solve the above technical problems, the present disclosure provides an LED hose lamp including:

an LED string light including a first conducting wire, a second conducting wire, a third conducting wire, a plurality of Surface Mounted Devices (SMD) LEDs and a plurality of encapsulation colloids; wherein the first conducting wire, the second conducting wire and the third conducting wire are arranged in parallel or intertwisted with each other; the first conducting wire, the second conducting wire and the third conducting wire all include a conducting wire core and an insulation layer covering a surface of the conducting wire core; the insulation layer of the first conducting wire is removed at intervals of a predetermined distance along an axial direction of the first conducting wire to form a plurality of first welding spots, the insulation layer of the second conducting wire is removed at intervals of the predetermined distance along an axial direction of the second conducting wire to form a plurality of second welding spots, positions of the first welding spots respectively correspond to positions of the second welding spots one to one, to form a plurality of lamp welding regions; the plurality of the SMD LEDs are respectively disposed at the plurality of lamp welding regions, two welding legs of each SMD LED are respectively welded onto the first welding spot and the second welding spot at one corresponding lamp welding region, the plurality of the SMD LEDs are connected in series, in parallel or in a hybrid; the plurality of the encapsulation colloids respectively coat the plurality of the SMD LEDs and surfaces of portions of the third conducting wire corresponding to positions of the plurality of the SMD LEDs, to form a plurality of lamp beads; and a soft tube coating the first conducting wire, the second conducting wire, the third conducting wire and the plurality of the lamp beads through an injection molding, or sleeving outside the first conducting wire, the second conducting wire, the third conducting wire and the plurality of the lamp beads.

The LED hose lamp provided by the present disclosure has three conducting wires. When the LED string lights are connected in series, the third conducting wire can increase the strength of the LED string light and prevent the SMD LED from falling off when pulling the LED string light. When the LED string lights are connected in parallel, the third conducting wire is connected in parallel with the first conducting wire or the second conducting wire, which is beneficial to reduce the voltage decay rate, such that the LED string light is not restricted by the power supply. Moreover, the LED string light is adapted to automatic production, which is beneficial to reduce the labor cost and the labor intensity, effectively improve the production efficiency and improve the finished product quality of the string light.

In an embodiment, positions of positive and negative poles two adjacent SMD LEDs are arranged in an opposite direction, the first conducting wire and the second conducting wire between every two adjacent SMD LEDs are alternately cut off, to make the SMD LEDs connected in series, wire residues formed by cutting the first conducting wire and the second conducting wire are encapsulated in the encapsulation colloid.

In an embodiment, every adjacent at least two SMD LEDs form a light emitting unit, positions of positive and negative poles of the SMD LEDs in each light emitting unit are arranged in a same direction, positions of positive and negative poles of the two adjacent light emitting units are arranged in an opposite direction, the first conducting wire and the second conducting wire between every two adjacent light emitting units are alternately cut off, to make the plurality of the SMD LEDs connected in a hybrid, the wire residues formed by cutting the first conducting wire and the second conducting wire are encapsulated in the encapsulation colloid.

In an embodiment, positions of positive and negative poles of the plurality of the SMD LEDs are arranged in a same direction, to make the plurality of the SMD LEDs connected in parallel, the third conducting wire is electrically connected to the first conducting wire or the second conducting wire through at least one jumper wire bridged between the third conducting wire and the first conducting wire or the second conducting wire.

A production method for an LED hose lamp is provided by the present disclosure, including:

supplying a first conducting wire and a second conducting wire in parallel by a first and second conducting wires supply mechanism;

transporting the first conducting wire and the second conducting wire to a wire stripping station by a wire transportation mechanism, to remove insulation layer of the first conducting wire and insulation layer of the second conducting wire at intervals of a predetermined distance through the wire stripping mechanism, to form first welding spots and second welding spots, wherein positions of the first welding spots respectively correspond to positions of the second welding spots one to one;

transporting the first welding spots and the second welding spots to a welding-material applying station through the wire transportation mechanism, to apply a welding material onto surfaces of the first welding spots and the second welding spots through the welding-material applying mechanism;

transporting the first welding spots and the second welding spots surfaces of which are applied with the welding material to an LED mounting station through the wire transportation mechanism, to place two welding legs of each SMD LED onto the first welding spot and the second welding spot respectively through an LED placement mechanism;

transporting the SMD LEDs placed on the first welding spots and the second welding spots to a welding station through the wire transportation mechanism, to weld the two welding legs of each SMD LED respectively with the first welding spot and the second welding spot through a welding mechanism;

transporting the welded SMD LEDs to a welding detection station through the wire transportation mechanism, to detect a welding quality of the SMD LEDs through a welding detection mechanism;

supplying a third conducting wire in parallel with the first conducting wire and the second conducting wire through a third conducting wire supply mechanism;

transporting the third conducting wire and the detected SMD LEDs to a first encapsulation station through the wire transportation mechanism, to encapsulate the each SMD LED and a portion of the third conducting wire corresponding to a position of the each SMD LED into the encapsulation colloid through a first encapsulation mechanism, to form a lamp bead;

transporting the lamp bead to a wire cutting station through the wire transportation mechanism, to determine, by a wire cutting mechanism, whether to perform a wire cutting, wherein if a determination result is yes, the first conducting wire or the second conducting wire between two adjacent lamp beads is cut off, if the determination result is no, the first conducting wire or the second conducting wire between the two adjacent lamp beads is not cut off;

transporting the lamp beads to a second encapsulation station through the wire transportation mechanism, wherein if the first conducting wire or the second conducting wire between the two adjacent lamp beads is cut off, each lamp bead and wire residues formed by cutting the first conducting wire or the second conducting wire are encapsulated in the encapsulation colloid through the second encapsulation mechanism; and coating surfaces of the first conducting wire, the second conducting wire, the third conducting wire and the lamp beads with an colloid to form a soft tube through an injection molding, or sleeving the first conducting wire, the second conducting wire, the third conducting wire and the lamp beads with the soft tube.

A production device for an LED hose lamp is provided by the present disclosure, including:

a first and second conducting wires supply mechanism configured to supply a first conducting wire and a second conducting wire in parallel;

a wire stripping mechanism configured to remove insulation layers on surfaces of the first conducting wire and the second conducting wire to form a plurality of first welding spots and a plurality of second welding spots;

a welding-material applying mechanism configured to apply a welding material onto surfaces of the first welding spots and the second welding spots;

an LED placement mechanism configured to mount two welding legs of a Surface Mounted Devices (SMD) LED onto a first welding spot and a second welding spot respectively;

a welding mechanism configured to weld the two welding legs of the SMD LED with the first welding spot and the second welding spot respectively;

a detection mechanism configured to detect a welding quality of the SMD LED;

a third conducting wire supply mechanism configured to supply a third conducting wire in parallel with the first conducting wire and the second conducting wire;

a first encapsulation mechanism configured to encapsulate the SMD LED and a portion of the third conducting wire corresponding to a position of the SMD LED into an encapsulation colloid to form a lamp bead;

a wire cutting mechanism configured to determine whether to perform a wire cutting, wherein if a determination result is yes, the first conducting wire or the second conducting wire between two adjacent lamp beads is cut off, if the determination result is no, the first conducting wire or the second conducting wire between the two adjacent lamp beads is not cut off;

a second encapsulation mechanism configured to encapsulate each lamp bead and wire residues formed by cutting the first conducting wire or the second conducting wire into the encapsulation colloid if the first conducting wire or the second conducting wire between the two adjacent lamp beads is cut off;

a wire transportation mechanism configured to transport the first conducting wire, the second conducting wire and the third conducting wire; and a terminal processing mechanism configured to coat the first conducting wire, the second conducting wire, the third conducting wire and the encapsulation colloid with an colloid through an injection molding to form a soft tube, or configured to sleeve the first conducting wire, the second conducting wire, the third conducting wire and the lamp beads with the soft tube.

In an embodiment, the welding mechanism includes:

a gas supply system configured to supply a gas source;

a hot air assembly configured to heat a gas output from the gas supply system and then blow the heated gas to the SMD LED, a first welding spot and a second welding spot;

a cold air assembly configured to blow the gas output from the gas supply system to the SMD LED and the first welding spot and the second welding spot; and a welding control system configured to control the hot air assembly to output a given heat energy, and control the cold air assembly to output a given cooling energy.

In an embodiment, the first encapsulation mechanism includes a first dispensing mechanism and a first curing mechanism, the first dispensing mechanism is configured to apply a liquid colloid onto the SMD LED and a surface of a portion of the third conducting wire corresponding to a position of the SMD LED, the first curing mechanism is configured to cure the liquid colloid.

In an embodiment, the first curing mechanism includes a pre-curing assembly and a secondary curing assembly, the pre-curing assembly includes a blowing-shaping device configured to blow and shape the liquid colloid and a pre-curing UV lamp configured to pre-cure the liquid colloid, the secondary curing assembly includes a curing UV lamp configured to cure the shaped and pre-cured liquid colloid.

In an embodiment, the wire cutting mechanism includes four wire cutting assemblies arranged in sequence along a direction of wire supplying, two of the wire cutting assemblies are configured to cut the first conducting wire between two SMD LEDs, and two remaining wire cutting assemblies are configured to cut the second conducting wire between the two SMD LEDs.

The advantageous effects of the additional technical features of the present disclosure will be illustrated in detail through embodiments in the present specification.

Reference signs are provided as follows:
10, support frame;
20, a first and second conducting wires supply mechanism;
30, wire-stripping mechanism;
40, conducting wire transportation mechanism;
50, welding-material applying mechanism;
60, LED placement mechanism;
70, welding mechanism; 71, hot air blowpipe; 72, hot air control valve; 73, temperature controller; 74, welding control system; 75, hot air barometer; 76, cold air blowpipe; 77, cold air control valve; 78, hot air supply pipe; 79, cold air supply pipe; 710, cold air barometer;
80, detection mechanism;
90, first encapsulation mechanism; 901, first dispensing mechanism; 902, first curing mechanism;
100, wire cutting mechanism; 101, upper stamping knife assembly; 102, upper stamping knife assembly driving device; 103, lower stamping knife assembly; 104, lower stamping knife assembly driving device;
110, second encapsulation mechanism; 111, second dispensing mechanism; 112, second curing mechanism;
120, a third conducting wire supply mechanism; 121, first mounting plate; 122, second mounting plate; 123, support; 124, first ceramic eyelet; 125, second ceramic eyelet; 126, first guide wheel; 127, second guide wheel; 128, third guide wheel; 129, fourth guide wheel; 1210, fifth guide wheel; 1211, doubling finger; 1212, mounting frame; 1213, sixth guide wheel;
130, terminal processing mechanism; 131, injection molding device; 132, cooling device;
140, LED hose lamp; 141, first conducting wire; 142, second conducting wire;
143, third conducting wire; 144, SMD LED; 145, encapsulation colloid; 146, jumper wire; 147, soft tube.

DETAILED DESCRIPTION OF THE EMBODIMENTS

The disclosure will be described in detail below with reference to the accompanying drawings in conjunction with the embodiments. It should be noted that the features in the following embodiments and embodiments may be combined with each other without conflict.

The terms "upper", "lower", "left", and "right" in the embodiments are merely used for convenience of description, and are not intended to limit the scope of implementation of the present disclosure; in addition, the changes or adjustments of the relative relationships of these terms should be regarded as being in the scope of implementation of the present disclosure.

Figure 1:
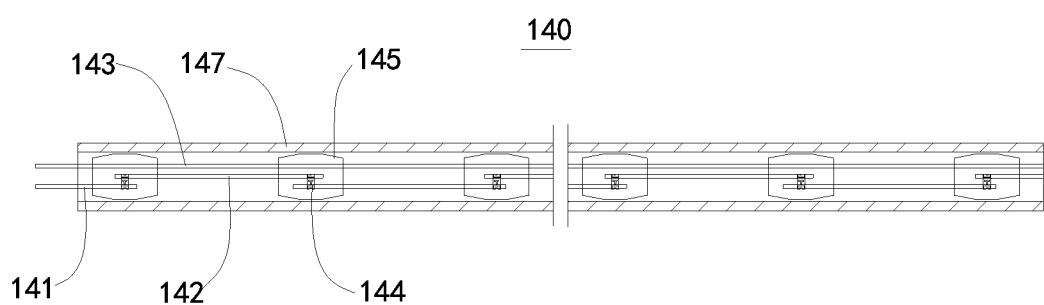
FIG. 1 is a schematic structure diagram illustrating an LED hose lamp according to an embodiment I of the present disclosure.

FIG. 1 is a schematic structure diagram of an LED hose lamp according to an embodiment I of the present disclosure. As shown in FIG. 1, the LED hose lamp includes an LED string light and a soft tube 147. The LED string light includes a first conducting wire 141, a second conducting wire 142, a third conducting wire 143, a plurality of SMD LEDs 144 and a plurality of encapsulation colloids 145. The first wire 141, the second wire 142 and the third wire 143 are arranged in parallel or intertwisted together. The first conducting wire 141, the second conducting wire and the third conducting wire all include a conducting wire core (not shown) and an insulation layer (not shown) covering the surface of the conducting wire core. The first conducting wire 141, the second conducting wire 142 and the third conducting wire 143 in the present embodiment may be rubber-covered wires or enamel-covered wires. A plurality of first welding spots (not shown) are formed by removing the insulation layer of the first conducting wire 141 at intervals of a predetermined length along the axial direction of the first conducting wire 141, and a plurality of second welding spots (not shown) are formed by removing the insulation layer of the second conducting wire 142 at intervals of a predetermined length along the axial direction of the second conducting wire 142. The position of the second welding spot corresponds to the position of the first welding spot one to one, to form a plurality of lamp-welding regions. The plurality of SMD LEDs 144 are disposed at the plurality of lamp-welding regions respectively. Two welding legs of the SMD LED 144 are respectively welded onto the first and second welding spots of the corresponding lamp-welding region. Positive-pole and negative-pole positions of two adjacent SMD LEDs are arranged in an opposite direction. The first conducting wire 141 and the second conducting wire 142 between every two adjacent SMD LEDs 144 are alternately cut off, that is, the first conducting wire 141 between the previous two adjacent SMD LEDs 144 is cut off, while the second conducting wire 142 is not cut off; and the first conducting wire 141 between the following two adjacent SMD LEDs 144 is not cut off, while the second conducting wire 142 is cut off, which cycle repeats to connect the plurality of SMD LEDs 144 in series. The plurality of encapsulation colloids 145 respectively cover the plurality of SMD LEDs 144 and the surfaces of portions of the third conducting wire 143 corresponding to the plurality of SMD LEDs 144, to form a plurality of lamp beads. The soft tube 147 coats the first conducting wire 141, the second conducting wire 142, the third conducting wire 143 and the plurality of LED lam beads by means of the injection molding, or the soft tube 147 sleeves the first conducting wire 141, the second conducting wire 142, the third conducting wire 143 and the plurality of LED lamp beads.

Figure 2:
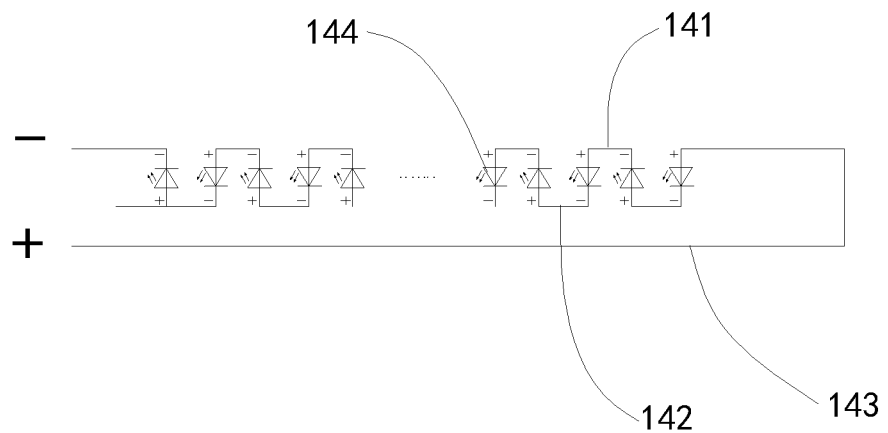
FIG. 2 is a schematic circuit diagram of an LED hose lamp according to the embodiment I of the present disclosure.

FIG. 2 is a schematic circuit diagram of the LED hose lamp according to the embodiment I of the present disclosure. In use of the LED hose lamp, one end of the first conducting wire 141 is connected to one end of the third conducting wire 143, the other end of the first conducting wire 141 and the other end of the third conducting wire 143 are connected to the negative and positive poles of a driving power supply (not shown), respectively.

For the LED hose lamp provided by the present disclosure, the LED string lights are connected in a series, and may be powered by a high voltage power supply (such as a power supply with a voltage of 220V). The third conducting wire 143 is connected to the first conducting wire 141 and the second conducting wire 142 through the encapsulation colloid 145, which is benefit for increasing the strength of the LED string light 140 and preventing the SMD LED 144 from falling off when the LED string light is pulled.

Figure 3:
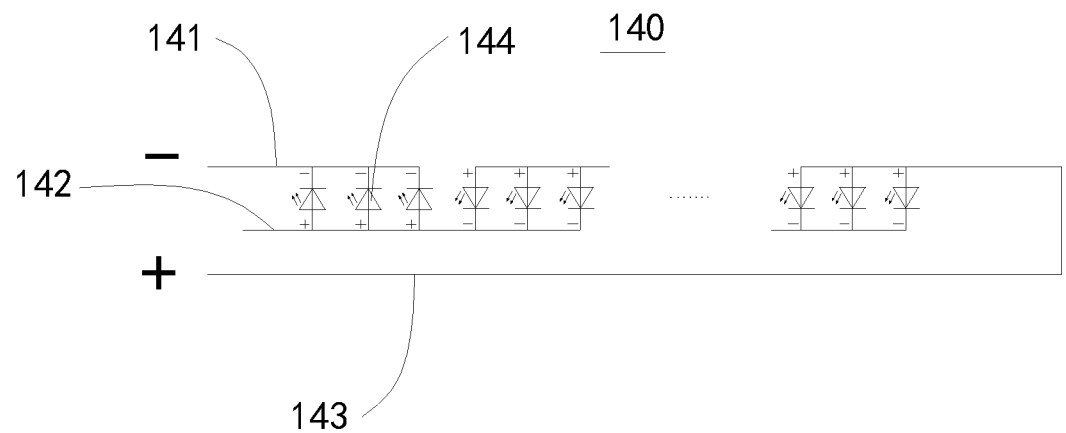
FIG. 3 is a schematic circuit diagram of an LED hose lamp according to an embodiment II of the present disclosure.

FIG. 3 is a schematic circuit diagram of an LED hose lamp according to an embodiment II of the present disclosure. The structure of the LED hose lamp in the present embodiment is substantially the same as that of the LED hose lamp in the embodiment I, except that: every adjacent at least two SMD LEDs 144 (four SMD LEDs in the present embodiment) form a light emitting unit. The SMD LEDs 144 in each light emitting unit are connected in parallel; positions of the positive and negative poles of the two adjacent light emitting units are arranged in an opposite direction; and the first conducting wire 141 and the second conducting wire 142 between every two adjacent light emitting units are alternately cut off, such that the plurality of SMD LEDs 144 are connected through a hybrid mode with parallel connection before series connection.

For the LED hose lamp provided by the present disclosure, the LED string lights are connected in hybrid, and may be powered by middle-high voltage power supply (such as a power supply with a voltage of 110V). Moreover, the third conducting wire 143 is connected with the first conducting wire and the second conducting wire through the encapsulation colloid 145, which is benefit for increasing the strength of the LED string light 140 and preventing the SMD LED 144 from falling off when the LED string light is pulled.

Figure 4:
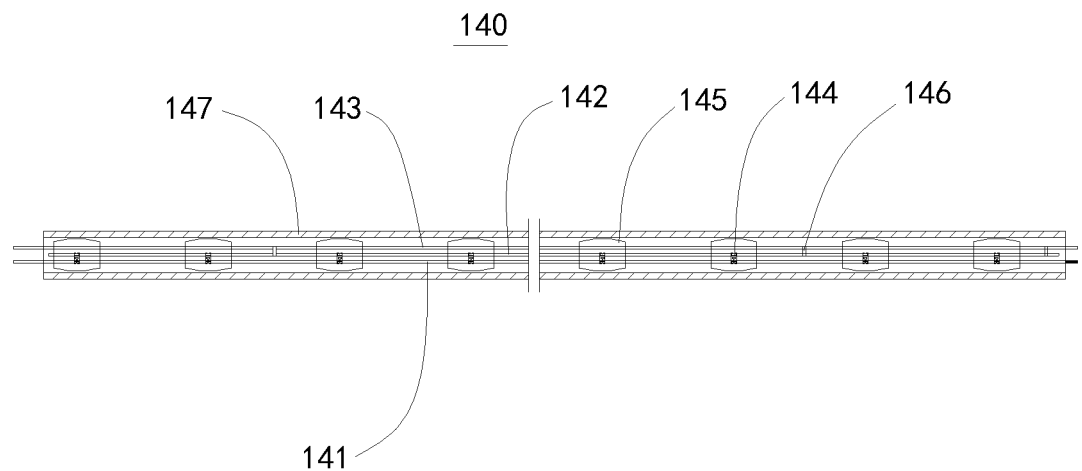
FIG. 4 is a schematic structure diagram of an LED hose lamp according to an embodiment III of the present disclosure.

FIG. 4 is a schematic structure diagram of a LED hose lamp according to an embodiment III of the present disclosure. As shown in FIG. 4, the structure of the LED string light in the embodiment III is substantially the same as that of the LED string light in the embodiment I, except that: the plurality of SMD LEDs 144 are connected in parallel through the first conducting wire 141 and the second conducting wire 142; and the third conducting wire 143 is connected to the first conducting wire 141 or the second conducting wire 142 through at least one jumper wire 146.

Figure 5:
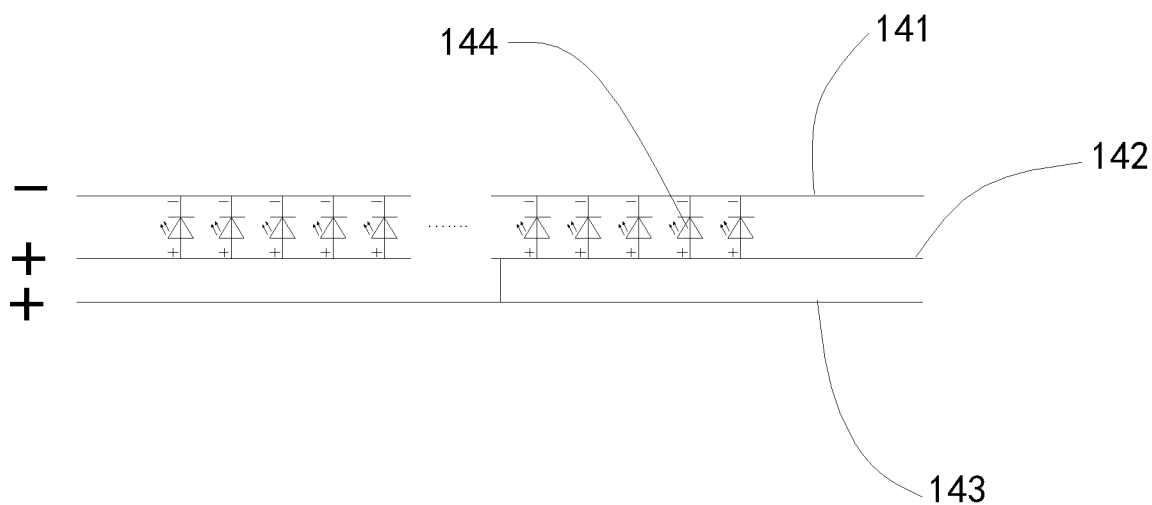
FIG. 5 is a schematic circuit diagram of the LED hose lamp according to the embodiment III of the present disclosure.

FIG. 5 is a schematic circuit diagram of the LED hose lamp according to the embodiment III of the present disclosure. In use of the LED hose lamp, the first conducting wire 141 is connected to the negative pole of the driving power supply, the second conducting wire and the third conducting wire are connected to the positive pole of the driving power supply.

The LED string light provided by the present disclosure is a LED string light connected in parallel, and may be powered by low voltage power supply (such as a power supply with a voltage of 3V). Moreover, the third conducting wire 143 is connected to the second wire 142 in parallel, which is equivalent to increasing the cross-sectional area of the second conducting wire 142, thereby effectively reducing the voltage attenuation, and being conducive to improving the glowing effect. In addition, the third conducting wire 143 is connected to the first conducting wire and the second conducting wire through the encapsulation colloid 145, which is benefit for increasing the strength of the LED string light 140 and preventing the SMD LED 144 from falling off when the LED string light is pulled.

Figure 6:
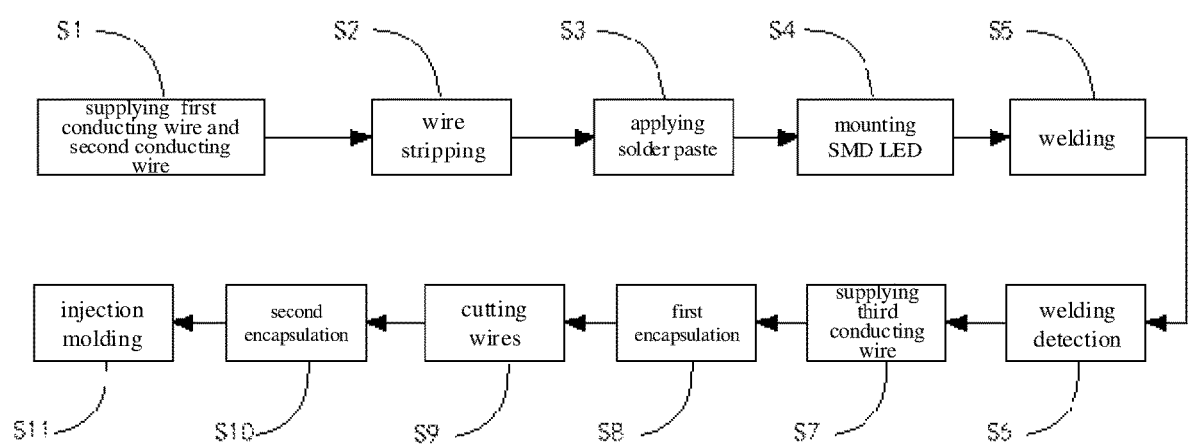
FIG. 6 is a flow chart of a production method for an LED hose lamp according to an embodiment of the present disclosure.

In another embodiment of the present disclosure, a production method for an LED hose lamp is provided. As shown in FIG. 6, the method includes the following steps.

Step S1: a first conducting wire and a second conducting wire are supplied. The first wire and the second wire are wired in parallel through a wiring mechanism for first and second conducting wires.

Step S2: wire stripping is performed. The first conducting wire and the second conducting wire are transported to a wire-stripping station through a wire transportation mechanism; the insulation layer on the surface of the first conducting wire 141 is removed at intervals of a predetermined distance through the wire-stripping mechanism to form the first welding spots, and similarly, the insulation layer on the second conducting wire 142 is removed at intervals of a predetermined distance through the wire-stripping mechanism form the second welding spots; the position of each first welding spot corresponds to the position of each second welding spot one to one.

Step S3: a spot welding is performed with a welding material. The first welding spots and the second welding spots are transported to a welding-material applying station through the wire transportation mechanism; surfaces of the first welding spots of the first conducting wire 141 and the second welding spots of the second conducting wire 142 are coated with the welding material through a welding-material applying mechanism. The welding material in the present embodiment is solder paste.

Step S4: the SMD LEDs are mounted. The first welding spot and the second welding spot with surfaces coated with the welding material are transported to a LED mounting station through the wire transportation mechanism; two welding legs of the SMD LED are respectively mounted onto the first welding spot and the second welding spot through the LED placement mechanism.

Step S5: welding is performed. The SMD LEDs placed on the first welding spots and the second welding spots are transported to a welding station through the wire transportation mechanism; two welding legs of the SMD LED 144 are respectively welded to the first welding spot of the first conducting wire 141 and the second welding spot of the second conducting wire 142 through a welding mechanism.

Step S6: welding detection is performed. The welded SMD LEDs are transported to a welding detection station through the wire transportation mechanism, and then the welding quality of the SMD LEDs 144 is detected through the welding detection mechanism.

Step S7: a third conducting wire 143 is supplied in parallel with the first conducting wire 141 and second conducting wire 142 through the wiring mechanism for the third conducting wire.

Step S8: first encapsulation is performed. The third conducting wire and the detected SMD LED are transported to a first encapsulation station through the wire transportation mechanism, and the SMD LED 144 and the portion of the third conducting wire 143 corresponding to the SMD LED 144 are encapsulated in the encapsulation colloid through the first encapsulation mechanism to form a lamp bead.

Step S9: the wire is cut. The lamp beads are transported to a wire cutting station through the wire transportation mechanism, to determine, through the wire cutting mechanism, whether to cut the wire; if yes, the first conducting wire 141 or the second conducting wire 142 between two adjacent SMD LEDs 144 is cut; if not, the first conducting wire or the second conducting wire between two adjacent lamp beads is not cut.

Step S10: a second encapsulation is performed. The lamp beads are transported to a second encapsulation station through the wire transportation mechanism; if the first conducting wire or the second conducting wire between two adjacent lamp beads is cut, the encapsulation colloid 145 and wire residues formed by cutting the first conducting wire 141 or the second conducting wire 142 are encapsulated into the encapsulation colloid through the second encapsulation mechanism.

Step S11: injection molding is performed. Through the mode of injection molding, the first conducting wire 141, the second conducting wire 142, the third conducting wire 143 and the lamp beads are coated with the colloids to form a soft tube 147, or a soft tube 147 sleeves the first conducting wire 141, the second conducting wire 142, the third conducting wire 143 and the lamp beads.

The production method for an LED hose lamp provided by the present disclosure can be applied to manufacture string lights connected in series, in parallel or in hybrid. The manufactured string light can use high or low voltage to power the string light, thereby extending the power supply conditions for the power supply of the string light, and broadening the usage occasions of the string light.

Figure 7:
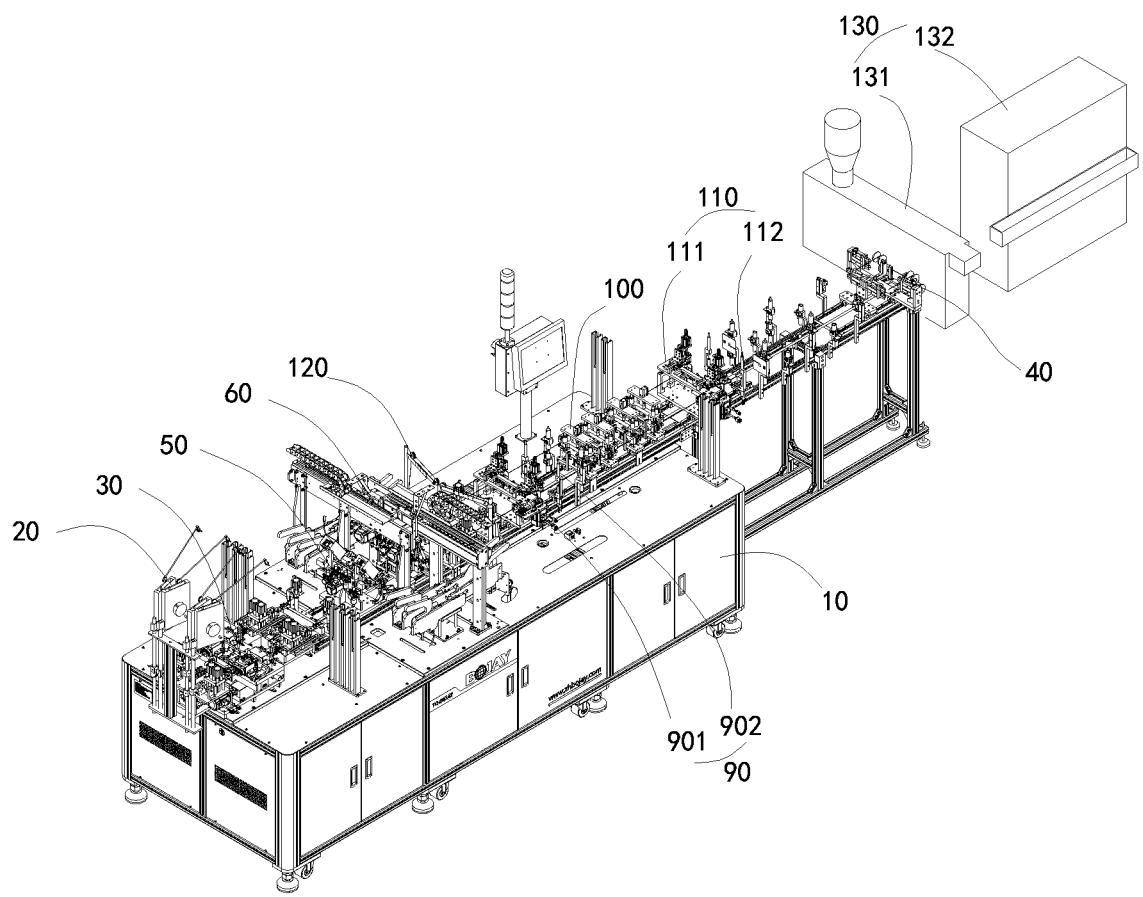
FIG. 7 is an axonometric view of a production device for an LED hose lamp viewed from front to back according to an embodiment of the present disclosure.
Figure 8:
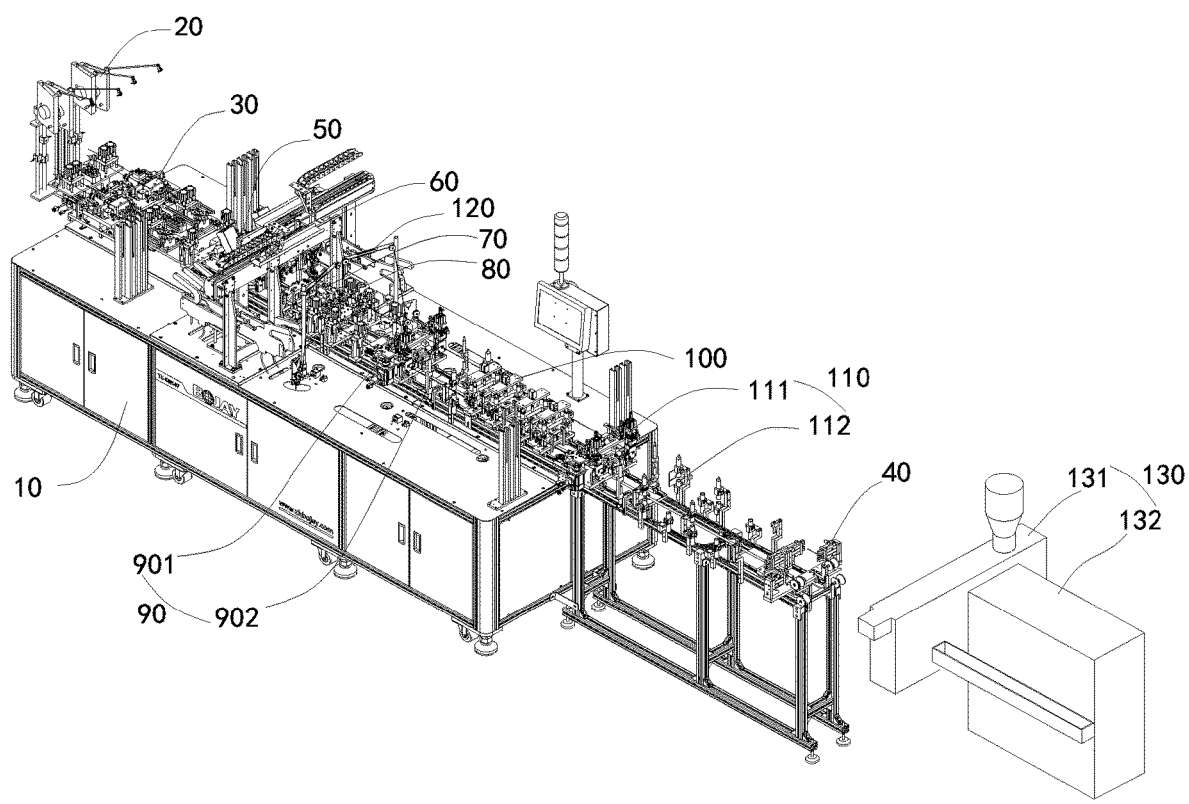
FIG. 8 is an axonometric view of a production device for an LED hose lamp viewed from back to front according to the embodiment of the present disclosure.

In another embodiment of the present disclosure, a production device for an LED hose lamp. As shown in FIGS. 7 and 8, the production device for the LED hose lamp includes: a first and second wires supply mechanism 20, a wire stripping mechanism 30, a welding-material applying mechanism 50, an LED placement mechanism 60, a welding mechanism 70, a detection mechanism 80, a third conducting wire supply mechanism 120, a first encapsulation mechanism 90, a wire cutting mechanism 100, a second encapsulation mechanism 110, a wire transportation mechanism 40 and a terminal processing mechanism 130, which are arranged in a straight line like an assembly line, to form an LED full-auto production line. In an embodiment, the production device for the LED hose lamp further includes support frames 10 for supporting the first and second conducting wires supply mechanism 20, the wire stripping mechanism 30, the welding-material applying mechanism 50, the LED placement mechanism 60, the welding mechanism 70, the detection mechanism 80, the third conducting wire supply mechanism 120, the first encapsulation mechanism 90, the wire cutting mechanism 100, the second encapsulation mechanism 110 and the wire transportation mechanism 40.

Preferably, the production device for the LED hose lamp in the present embodiment includes two LED full-auto production line arranged in parallel. In this way, two LED string light can be manufactured simultaneously, thereby significantly improving the production efficiency.

The first and second conducting wires supply mechanism 20 is configured to supply the first conducting wire 141 and the second conducting wire 142. The first and second conducting wires supply mechanism 20 in the present embodiment includes a tension controller. The tension controller is configured to provide a reversed tension in a wire supply direction for the first conducting wire 141 and the second conducting wire 142, to cooperate with a conducting wire compression assembly to make the conducting wire be in a tensioning state.

The wire stripping mechanism 30 is configured to remove the insulation layers on the surfaces of the first conducting wire 141 and the second conducting wire 142 at intervals of a predetermined distance to form the first welding spots and the second welding spots respectively. The wire stripping mechanism 30 in the present embodiment includes the conducting wire compression assembly and a wire stripping knife assembly. The conducting wire compression assembly is configured to position and compress the first conducting wire 141 and the second conducting wire 142, for providing a positioning basis when performing the wire stripping. The conducting wire compression assembly in the present embodiment includes a front conducting-wire compression mechanism and a rear conducting-wire compression mechanism arranged oppositely at a certain interval along a direction of movement of the first conducting wire 141 and the second conducting wire 142. In an embodiment, both the front conducting-wire compression mechanism and rear conducting-wire compression mechanism include a cushion block, a briquetting above the cushion block and a cylinder for driving the briquetting to move up and down with respect to the cushion block. The wire stripping knife assembly is positioned between the front conducting-wire compression mechanism and the rear conducting-wire compression mechanism, and is configured to remove the insulation layers (such as insulation varnish or insulation paste) on the surfaces at the welding positions on the first conducting wire 141 and the second conducting wire 142, to form the first welding spots and the second welding spots. The wire stripping knife assembly is the prior art, which is not described here.

The welding-material applying mechanism 50 is configured to apply the welding materials to the first welding spots of the first conducting wire 141 and the second welding spots of the second wire 142. The welding-material applying mechanism 50 in the present embodiment includes a visual positioning assembly, a conducting-wire positioning assembly and a solder applying assembly. The visual positioning assembly and the conducting-wire positioning assembly are configured to accurately position the first welding spots of the first conducting wire 141 and the second welding spots of the second wire 142. The solder applying assembly is configured to apply the welding material onto the first welding spots of the first conducting wire 141 and the second welding spots of the second wire 142. In an embodiment, the solder applying assembly includes a solder applying syringe located above the first conducting wire 141 and the second conducting wire 142 and a solder applying air feeder to supply air to the solder applying syringe.

The LED placement mechanism 60 is configured to mount the two welding legs of the SMD LED 144 to the first welding spot of the first conducting wire 141 and the second welding spot of the second wire 142 coated with the welding material respectively. In an embodiment, the LED placement mechanism 60 includes an SMD LED supply assembly, an SMD LED absorption and release assembly and an SMD LED transportation assembly. The SMD LED supply assembly is configured to accurately transport the SMD LED 144 to an SMD LED feeding position. The SMD LED supply assembly in the present embodiment includes a lamp bead tray and a feeder positioning device. The SMD LED absorption and release assembly is configured to absorb the SMD LED 144 at the SMD LED feeding position and put down the SMD LED 144 at an LED blanking position. The SMD LED absorption and release assembly in the present embodiment includes an absorption rod for absorbing the SMD LED 144 and a vacuum ejector connected to the absorption rod. The SMD LED transportation assembly is configured to drive the SMD LED absorption and release assembly to reciprocate between the SMD LED 144 feeding position and the SMD LED 144 blanking position. The SMD LED transportation assembly in the present embodiment includes a single-axis robot.

Figure 9:
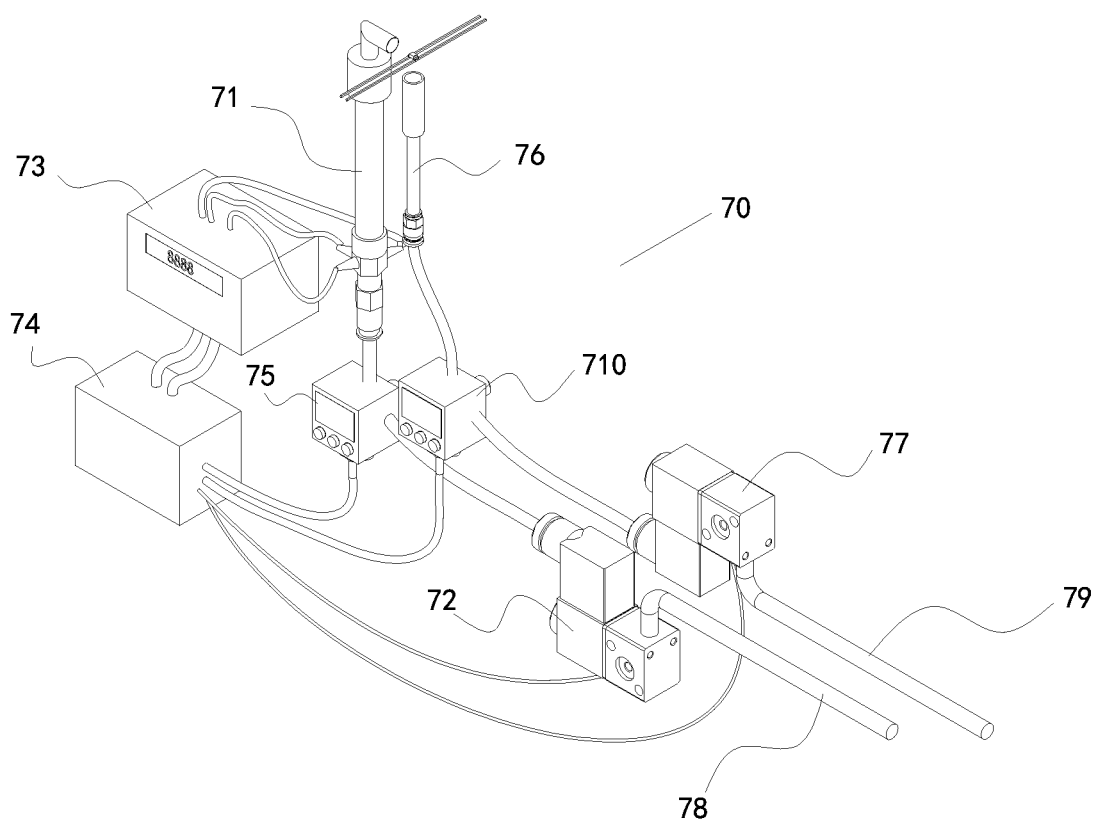
FIG. 9 is a schematic diagram of a three-dimensional structure of a welding mechanism of a production device for an LED hose lamp according to an embodiment of the present disclosure.

The welding mechanism 70 is configured to weld the two welding legs of the SMD LED 144 to the first welding spot of the first conducting wire 141 and the second welding spot of the second conducting wire 142 respectively. As shown in FIG. 9, the welding mechanism 70 in the present embodiment may include a gas supply system (not shown), a hot air assembly, a cold air assembly and a welding control system 74. The gas supply system is configured to supply a gas source. The gas supply system in the present embodiment is a gas cylinder. The hot air assembly is configured to heat the gas output from the gas supply system and then blow it to the SMD LED 144 placed at the first welding spot of the first conducting wire 141 and the second welding spot of the second conducting wire 142. The hot air assembly in the present embodiment includes a hot air blowpipe 71, a heating device (not shown) and a temperature controller 73. An inlet port of the hot air blowpipe 71 communicates with a vent hole of the gas supply system through a hot air control valve 72 and a hot air supply pipe 78. The outlet port of the hot air blowpipe 71 faces the SMD LED 144 placed at the first welding spot of the first conducting wire 141 and the second welding spot of the second conducting wire 142. The heating device is disposed in the hot air blowpipe 71. The temperature controller 73 is connected to the heating device. The temperature controller 73 is configured to accurately control the temperature of the heating device. In an embodiment, the hot air assembly further includes a hot air barometer 75 for detecting the air pressure value in the hot air blowpipe 71. The cold air assembly is configured to blow the gas output from the gas supply system to the SMD LED 144 placed at the first welding spot of the first conducting wire 141 and the second welding spot of the second conducting wire 142. The cold air assembly in the present embodiment includes a cold air blowpipe 76. The inlet port of the cold air blowpipe 76 communicates with the vent hole of the gas supply system through a cold air control valve 77 and a cold air supply pipe 79. The outlet port of the cold air blowpipe 76 faces the SMD LED 144 placed at the first welding spot of the first conducting wire 141 and the second welding spot of the second conducting wire 142. Preferably, the cold air assembly further includes a cold air barometer 710 for detecting the air pressure value in the cold air blowpipe 76, and the cold air barometer 710 is utilized to accurately output the cooling energy. The welding control system 74 is connected to the temperature controller 73, the hot air control valve 72, the hot air barometer 75, the cold air control valve 77 and the cold air barometer 710. The temperature of the hot air is controlled according to the temperature controller 73; and the air volume of the hot air is controlled according to the hot air barometer 75 and the cold air control valve 77, thereby implementing the accurate control of the heat energy required for welding. The air volume of the cold air is controlled according to the cold air control valve 77 and the cold air barometer 710, to implement the accurate control of the cooling energy required for welding. The LED welding mechanism 70 in the present embodiment has the advantages of precise adjustment of temperature, energy conservation and environment protection, fast welding speed and small external dimensions.

The detection mechanism 80 is configured to detect the welding quality of the SMD LEDs 144. The detection mechanism 80 includes a power-on assembly and a photosensitive detection assembly. The power-on assembly is configured to provide a voltage between the first conducting wire 141 and the second conducting wire 142. The photosensitive detection assembly utilizes a photosensitive detection or a visual detection to determine the lighting of the welding for the LED and send out signals of good products and defective products.

Figure 10:
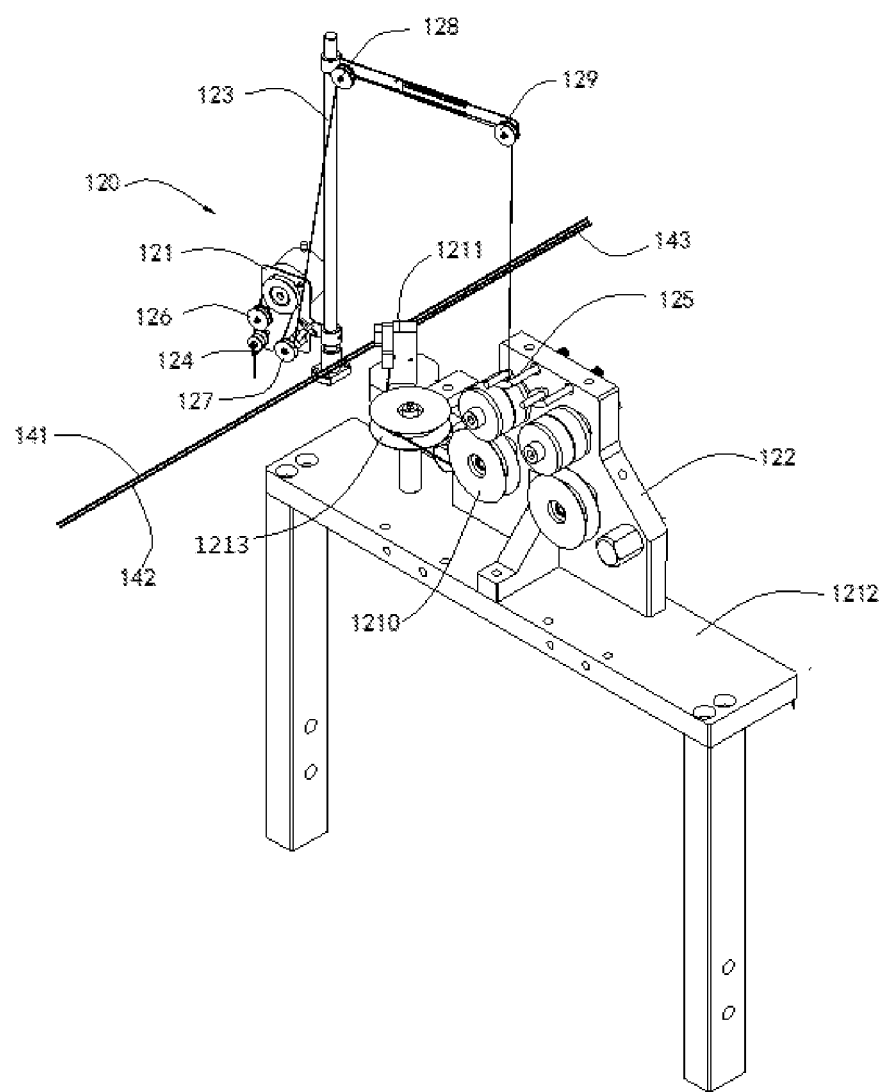
FIG. 10 is a three-dimensional diagram of a wiring mechanism of a third conducting wire of a production device for an LED hose lamp according to an embodiment of the present disclosure.

The third conducting wire supply mechanism 120 is configured to supply the third conducting wire 143 in parallel with the first conducting wire 141 and the second conducting wire 142. As shown in FIG. 10, the third conducting wire supply mechanism 120 includes a third conducting wire positioning component, a third conducting wire guiding component, a height adjustment mechanism, a first mounting plate 121, a support 123 and a mounting frame 1212. The first mounting plate 121, the support 123 and the mounting frame 1212 are fixed on the support frame 10; and the mounting frame 1212 is provided with a vertical second mounting plate 122. The third conducting wire positioning component is configured to position the third conducting wire 143. The third conducting wire positioning component in the present embodiment includes a first ceramic eyelet 124 and a second ceramic eyelet 125. The first ceramic eyelet 124 and the second ceramic eyelet 125 are respectively mounted on the first mounting plate 121 and the second mounting plate 122. The third conducting wire guiding component is configured to guide the third conducting wire 143. The third conducting wire guiding component in the present embodiment includes a first guide wheel 126, a second guide wheel 127, a third guide wheel 128, a fourth guide wheel 129, a fifth guide wheel 1210 and a sixth guide wheel 1213. The first guide wheel 126 and the second guide wheel 127 are mounted on the first mounting plate 121. The third guide wheel 128 and the fourth guide wheel 129 are mounted on the support 123. The fifth guide wheel 1210 and the sixth guide wheel 1213 are mounted on the second mounting plate 122. The height adjustment mechanism is configured to adjust the height of the third conducting wire 143. The height adjustment mechanism includes a wire doubling finger 1211 and a regulating nut. An upper end of the wire doubling finger 1211 is provided with a wire passing groove through which the third wire 143 passes. A lower end of the wire doubling finger 1211 passes through the mounting frame 1212 and is in threaded connection with the regulating nut. The height of the wire doubling finger 1211 is adjusted through the regulating nut, thereby the height of the third conducting wire 143 is adjusted. After passing through the first ceramic eyelet 124, the third conducting wire 143 bypasses the first guide wheel 126, the second guide wheel 127 and then goes upwards, then bypasses the third guide wheel 128 and the fourth guide wheel 129 and then goes downwards, and then passes through the second ceramic eyelet 125, bypasses the fifth guide wheel 1210 and the sixth guide wheel 1213, goes through the wire doubling finger 1211, and then is supplied in parallel with the first conducting wire 141 and the second conducting wire 142.

The first encapsulation mechanism 90 is configured to encapsulate the SMD LED 144 and the portion of the third conducting wire 143 corresponding to the SMD LED 144 into the encapsulation colloid 145. The first encapsulation mechanism 90 in the present embodiment includes a first dispensing mechanism 901 and a first curing mechanism 902. The first dispensing mechanism 901 is configured to apply the encapsulation colloid onto the SMD LED 144 and the surface of the portion of the third conducting wire 143 corresponding to the SMD LED 144. The first curing mechanism 902 is configured to cure the liquid colloid on the SMD LED 144 and on the surface of the portion of the third conducting wire 143 corresponding to the SMD LED 144.

The first curing mechanism 902 in the present embodiment rapidly cures the liquid colloid by using the principle of UV dry colloid. Preferably, the first curing mechanism 902 includes a pre-curing assembly and a secondary curing assembly which are arranged in sequence in a direction of supplying wire. The pre-curing assembly includes a pre-curing UV lamp and a blowing-shaping device arranged along an up-down direction. The UV lamp is configured to irradiate the liquid colloid applied on the SMD LED 144. The blowing-shaping device outputs the airflow to blow, shape and pre-cure the liquid colloid, to maintain the welding strength of the conducting wires of the lamp bead, and keep the lamp bead and the conducting wire insulated from the outside word. The secondary curing assembly is configured to further cure the preliminary cured and shaped encapsulation colloid, to ensure the welding strength between the SMD LED 144 and the conducting wire. The secondary curing assembly includes a curing UV lamp.

Figure 11:
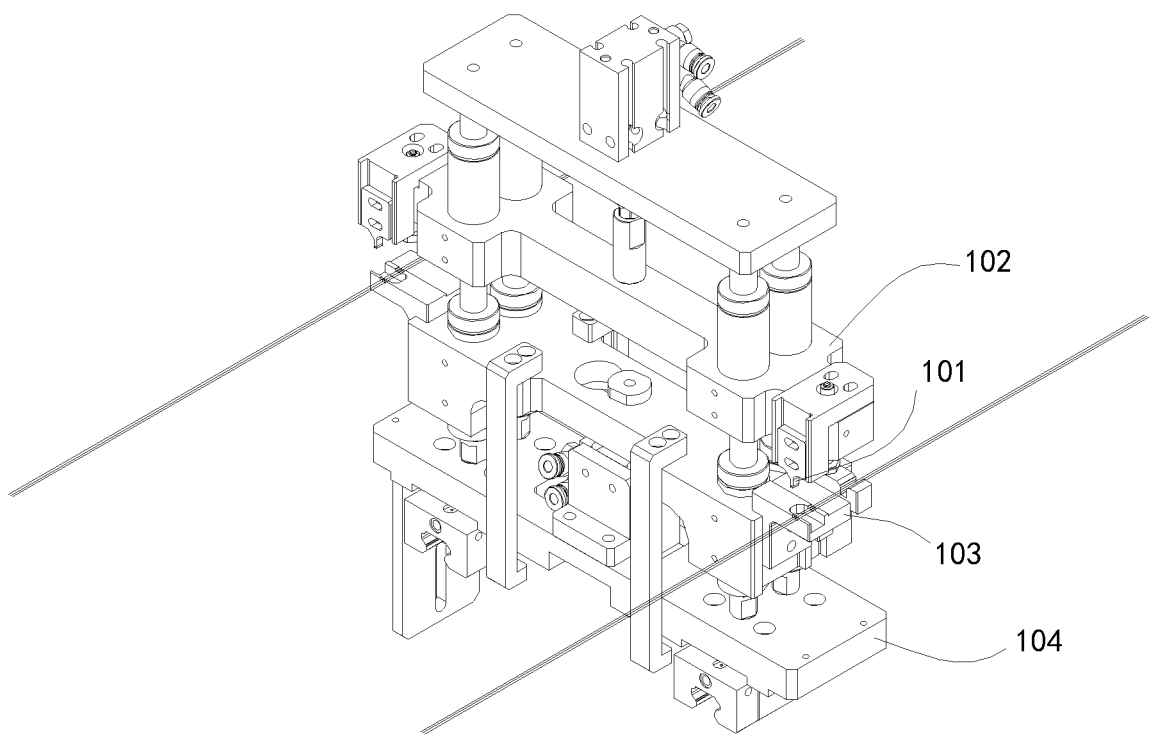
FIG. 11 is a three-dimensional diagram of a wire cutting mechanism of a production device for an LED hose lamp according to an embodiment of the present disclosure.

The wire cutting mechanism 100 is configured to determine whether the wire cutting is performed. If yes, the first conducting wire 141 or the second conducting wire 142 between two adjacent SMD LEDs 144 is cut off. If no, the first conducting wire or the second conducting wire between two adjacent lamp beads is not cut off. As shown in FIG. 11, the wire cutting mechanism 100 includes an upper stamping knife assembly 101, an upper stamping knife assembly driving device 102 for driving the upper stamping knife assembly 101 to move up and down, a lower stamping knife assembly 103 and a lower stamping knife assembly driving device 104 for driving the lower stamping knife assembly 103 to move up and down.

The second encapsulation mechanism 110 is configured to encapsulate the lamp bead and wire residues formed by cutting the first conducting wire or the second conducting wire into the encapsulation colloid if the first conducting wire or the second conducting wire between two adjacent lamp beads is cut off. The second encapsulation mechanism 100 in the present embodiment includes a second dispensing mechanism 111 and a second curing mechanism 112. The second dispensing mechanism 111 is configured to apply the encapsulation colloid onto the surface of the encapsulation colloid 145. The second dispensing mechanism 111 has a same structure as the first dispensing mechanism 901, and the description thereof will not be repeated herein. The second curing mechanism 112 is configured to cure the liquid colloid on the surface of the encapsulation colloid 145. The second curing mechanism 112 has a same structure as the first curing mechanism 902, and the description thereof will not be repeated herein.

The wire transportation mechanism 40 is configured to provide a power for the conducting wire to move ahead. The wire transportation mechanism 40 in the present embodiment includes a plurality of linear single-axis robots and a plurality of pneumatic fingers. The plurality of linear single-axis robots are arranged at intervals along the direction of supplying wire, to provide a linear pull power and provide the linear pull power to a mounting platform of the pneumatic fingers. The plurality of pneumatic fingers are respectively mounted on the plurality of linear single-axis robots, to function as positioning and compressing the conducting wire.

The terminal processing mechanism 110 is configured to coat the first conducting wire, the second conducting wire, the third conducting wire and the encapsulation colloid with the colloid to form a soft tube 147. The terminal processing mechanism 130 in the present embodiment includes an injection molding device 131, a cooling device 132 and a material receiving device. The injection molding device 131 is configured to coat the first conducting wire, the second conducting wire, the third conducting wire and the encapsulation colloid with an colloid. The cooling device 132 is configured to rapidly cool the colloid. The material receiving device is configured to perform the material receiving on the LED hose lamp. As an alternative solution, the terminal processing mechanism 130 may also be a sleeve device, and the LED hose sleeves the LED string light through the sleeve device.

The production device for the LED hose lamp provided by the present disclosure can automatically produce string lights connected in series, in parallel or in hybrid, which reduces the labor costs and the labor intensity, effectively improves production efficiency, and improves the quality of finished string light. Moreover, the produced string light can be powered by a high or low voltage, thereby extending the power supply conditions for the power supply of the string light, and broadening the usage occasion of the string light.

The above embodiments are merely several embodiments of the present disclosure, although the description thereof is more specific and detailed, but it is not construed as limiting the scope of the disclosure. It should be noted that a number of variations and modifications can be made by those skilled in the art without departing from the concept of the disclosure, and those variations and modifications are also fallen in the scope of protection of the present disclosure.

What is claimed is:
1. An LED hose lamp, comprising:
  an LED string light comprising a first conducting wire, a second conducting wire, a third conducting wire, a plurality of Surface Mounted Devices (SMD) LEDs and a plurality of encapsulation colloids; wherein the first conducting wire, the second conducting wire and the third conducting wire are arranged in parallel or intertwisted with each other; the first conducting wire, the second conducting wire and the third conducting wire all comprise a conducting wire core and an insulation layer covering a surface of the conducting wire core; the insulation layer of the first conducting wire is removed at intervals of a predetermined distance along an axial direction of the first conducting wire to form a plurality of first welding spots, the insulation layer of the second conducting wire is removed at intervals of the predetermined distance along an axial direction of the second conducting wire to form a plurality of second welding spots, positions of the first welding spots respectively correspond to positions of the second welding spots one to one, to form a plurality of lamp welding regions; the plurality of the SMD LEDs are respectively disposed at the plurality of lamp welding regions, two welding legs of each SMD LED are respectively welded onto the first welding spot and the second welding spot at one corresponding lamp welding region, the plurality of the SMD LEDs are connected in series, in parallel or in a hybrid; the plurality of encapsulation colloids respectively coat the plurality of the SMD LEDs and surfaces of portions of the third conducting wire corresponding to positions of the plurality of the SMD LEDs, to form a plurality of lamp beads; and a soft tube coating the first conducting wire, the second conducting wire, the third conducting wire and the plurality of the lamp beads through an injection molding, or sleeving outside the first conducting wire, the second conducting wire, the third conducting wire and the plurality of the lamp beads.

2. The LED hose lamp according to claim 1, wherein positions of positive and negative poles of two adjacent SMD LEDs are arranged in an opposite direction, the first conducting wire and the second conducting wire between every two adjacent SMD LEDs are alternately cut off, to make the SMD LEDs connected in series, wire residues formed by cutting the first conducting wire and the second conducting wire are encapsulated in the encapsulation colloid.

3. The LED hose lamp according to claim 1, wherein every at least two adjacent SMD LEDs form a light emitting unit, positions of positive and negative poles of the SMD LEDs in each light emitting unit are arranged in a same direction, positions of positive and negative poles of the two adjacent light emitting units are arranged in an opposite direction, the first conducting wire and the second conducting wire between every two adjacent light emitting units are alternately cut off, to make the plurality of the SMD LEDs connected in a hybrid, the wire residues formed by cutting the first conducting wire and the second conducting wire are encapsulated in the encapsulation colloid.

4. The LED hose lamp according to claim 1, wherein positions of positive and negative poles of the plurality of the SMD LEDs are arranged in a same direction, to make the plurality of the SMD LEDs connected in parallel, the third conducting wire is electrically connected to the first conducting wire or the second conducting wire through at least one jumper wire bridged between the third conducting wire and the first conducting wire or the second conducting wire.

5. A production method for an LED hose lamp, comprising:

supplying a first conducting wire and a second conducting wire in parallel by a first and second conducting wires supply mechanism;

transporting the first conducting wire and the second conducting wire to a wire stripping station by a wire transportation mechanism, to remove an insulation layer of the first conducting wire and an insulation layer of the second conducting wire at intervals of a predetermined distance through the wire stripping mechanism, to form first welding spots and second welding spots, wherein positions of the first welding spots respectively correspond to positions of the second welding spots one to one;

transporting the first welding spots and the second welding spots to a welding-material applying station through the wire transportation mechanism, to apply a welding material onto surfaces of the first welding spots and the second welding spots through the welding-material applying mechanism;

transporting the first welding spots and the second welding spots surfaces of which are applied with the welding material to an LED mounting station through the wire transportation mechanism, to place two welding legs of each SMD LED onto the first welding spot and the second welding spot respectively through an LED placement mechanism;

transporting the SMD LEDs placed on the first welding spots and the second welding spots to a welding station through the wire transportation mechanism, to weld the two welding legs of each SMD LED respectively with the first welding spot and the second welding spot through a welding mechanism;

transporting the welded SMD LEDs to a welding detection station through the wire transportation mechanism, to detect a welding quality of the SMD LEDs through a welding detection mechanism;

supplying a third conducting wire in parallel with the first conducting wire and the second conducting wire through a third conducting wire supply mechanism;

transporting the third conducting wire and the detected SMD LEDs to a first encapsulation station through the wire transportation mechanism, to encapsulate each SMD LED and a portion of the third conducting wire corresponding to a position of the each SMD LED into an encapsulation colloid through a first encapsulation mechanism, to form a lamp bead;

transporting the lamp bead to a wire cutting station through the wire transportation mechanism, to determine, by a wire cutting mechanism, whether to perform a wire cutting, wherein if a determination result is yes, the first conducting wire or the second conducting wire between two adjacent lamp beads is cut off, if the determination result is no, the first conducting wire or the second conducting wire between the two adjacent lamp beads is not cut off;

transporting the lamp beads to a second encapsulation station through the wire transportation mechanism, wherein if the first conducting wire or the second conducting wire between the two adjacent lamp beads is cut off, each lamp bead and wire residues formed by cutting the first conducting wire or the second conducting wire are encapsulated in the encapsulation colloid through a second encapsulation mechanism; and coating surfaces of the first conducting wire, the second conducting wire, the third conducting wire and the lamp beads with an colloid to form a soft tube through an injection molding, or sleeving the first conducting wire, the second conducting wire, the third conducting wire and the lamp beads with the soft tube.

\* \* \* \* \*